(12) United States Patent
Hsiao et al.

(10) Patent No.: US 11,024,700 B2
(45) Date of Patent: Jun. 1, 2021

(54) DISPLAY DEVICE

(71) Applicant: HUIZHOU CHINA STAR OPTOELECTRONICS TECHNOLOGY CO., LTD., Huizhou Guangdong (CN)

(72) Inventors: Yuchun Hsiao, Huizhou Guangdong (CN); Chunchi Chen, Huizhou Guangdong (CN)

(73) Assignee: HUIZHOU CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 388 days.

(21) Appl. No.: 16/088,366

(22) PCT Filed: Sep. 7, 2018

(86) PCT No.: PCT/CN2018/104512
§ 371 (c)(1),
(2) Date: Sep. 25, 2018

(87) PCT Pub. No.: WO2019/205414
PCT Pub. Date: Oct. 31, 2019

(65) Prior Publication Data
US 2020/0168696 A1    May 28, 2020

(30) Foreign Application Priority Data
Apr. 24, 2018  (CN) .......................... 201810373350.0

(51) Int. Cl.
*H01L 27/32*    (2006.01)
*G02F 1/1333*    (2006.01)
(Continued)

(52) U.S. Cl.
CPC ...... *H01L 27/3293* (2013.01); *G02F 1/13336* (2013.01); *H01L 27/156* (2013.01);
(Continued)

(58) Field of Classification Search
None
See application file for complete search history.

(56) References Cited

U.S. PATENT DOCUMENTS

2016/0019019 A1* 1/2016 Ikeda ..................... G06F 3/0412
345/173
2019/0049817 A1* 2/2019 Sun .......................... G02F 1/23

FOREIGN PATENT DOCUMENTS

CN    201374154 Y    12/2009
CN    105044964 A    11/2015
(Continued)

*Primary Examiner* — Dung A. Le
(74) *Attorney, Agent, or Firm* — Leong C. Lei

(57) ABSTRACT

A display device is provided. The display device provides an electroluminescent display panel above the joint display panel. An orthographic projection of the electroluminescent layer on the joint display panel us overlapped with the edge frames of the display panel, and the electroluminescent layer includes multiple electroluminescent device. When the display device is operating, the multiple sub-display panels of the display panel and the multiple electroluminescent devices of the electroluminescent display panel can simultaneously emit a light in order to display an image in order to eliminate a black line generated by the edge frames of the joint display panel in order to increase the display effect to have a good product quality.

9 Claims, 4 Drawing Sheets

(51) Int. Cl.
*H01L 27/15* (2006.01)
*H01L 33/48* (2010.01)
*H01L 33/52* (2010.01)
*H01L 51/52* (2006.01)
*H01L 51/56* (2006.01)

(52) U.S. Cl.
CPC ...... *H01L 27/3211* (2013.01); *H01L 27/3244* (2013.01); *H01L 33/483* (2013.01); *H01L 33/52* (2013.01); *H01L 51/5246* (2013.01); *H01L 51/5253* (2013.01); *H01L 51/5284* (2013.01); *H01L 51/56* (2013.01); *G02F 2201/44* (2013.01); *H01L 2227/323* (2013.01)

(56) References Cited

FOREIGN PATENT DOCUMENTS

| | | |
|---|---|---|
| CN | 106033159 A | 10/2016 |
| CN | 206697160 U | 12/2017 |
| JP | 2007-192977 A | 8/2007 |

* cited by examiner

DISPLAY DEVICE

RELATED APPLICATIONS

The present application is a National Phase of International Application No. PCT/CN2018/104512, filed Sep. 7, 2018, and claims the priority of China Application No. 201810373350.0, filed Apr. 24, 2018.

FIELD OF THE INVENTION

The present invention relates to a display technology field, and more particularly to a display device.

BACKGROUND OF THE INVENTION

In the display technology field, a flat display device such as a Liquid Crystal Display (LCD) has gradually replaced the Cathode Ray Tube (CRT) display device. The LCD has many advantages of thin body, power saving, no radiation so that the LCD has been widely applied.

The LCD display device in the current market is usually a back-light type liquid crystal display device, and including a liquid crystal display panel and a backlight module. Usually, the liquid crystal display panel is formed by a Color Filter (CF) substrate, a Thin Film Transistor (TFT) array substrate, a Liquid Crystal (LC) clamped between the color filter substrate and the TFT array substrate and a sealant. The operation principle is that placing liquid crystal molecules between two parallel glass substrates, at middle portion of the two glass substrates, many vertical and horizontal fine wires are existed, through applying a voltage to control the direction of the liquid crystal molecules such that the light emitted from the backlight module is refracted in order to generate a picture.

Along with the development of display technology, more and more display devices having larger display area are required in the application. The conventional display device having a single display panel cannot meet this requirement, and a display device formed by multiple jointed display panels is formed. With reference to FIG. 1, which is a schematic structural diagram of a conventional display device formed by two display panels jointed together. The display device includes two liquid crystal display panels 100 arranged at intervals, and a black matrix (BM) frame 200 disposed at outer sides of the two liquid crystal display panels 100. When the display device is displaying, the two liquid crystal display panels 100 can display, but the black matrix 200 cannot be displayed, which causes a black line corresponding to the black matrix 200 to be generated on the display screen of the display device. The display effect is affected, and the product quality is poor.

The Organic Light-Emitting Diode (OLED) display device is a new flat display device. The OLED display device has a broad application prospects because of self-emission, simple manufacturing process, low cost, low power consumption, high light-emitting brightness, wide operating temperature range, small size, fast response speed, easy implementation of color display and large-screen display, easy for implementing and matching with integrated circuit driver, easy for achieving a flexible display.

A mini LED display device is a display device that integrates small size LED array on a substrate to function as a display pixel to realize an image display. Each pixel can be addressed, individually driving, and belong to a self-luminous display. The mini LED has a low power consumption and the color saturation is closed to the OLED so that companies regard the mini LED as a current research focus.

SUMMARY OF THE INVENTION

The purpose of the present invention is to provide a display device that can eliminate the black line in the display screen of the jointed display panels, and has a higher product quality.

In order to achieve the above purpose, the present invention provides with a display device, comprising: a joint display panel including multiple sub-display panels disposed at interval, a first edge frame disposed between adjacent sub-display panels, and a second edge frame disposed at outer side of the multiple sub-display panels; and an electroluminescent display panel including a substrate and an electroluminescent layer disposed on the substrate, an orthographic projection of the electroluminescent layer on the joint display panel is overlapped with the first edge frame and the second edge frame; wherein the electroluminescent layer includes multiple electroluminescent devices disposed sequentially.

Wherein each of the sub-display panel is a liquid crystal display panel, and the multiple sub-display panels are arranged as a matrix.

Wherein the electroluminescent device is a mini LED.

Wherein the electroluminescent device is an OLED.

Wherein the electroluminescent display panel further includes an encapsulation layer that covers the multiple electroluminescent devices.

Wherein the electroluminescent device includes a red electroluminescent device, a green electroluminescent device and a blue electroluminescent device, in the electroluminescent layer, the red electroluminescent device, the green electroluminescent device and the blue electroluminescent device are disposed sequentially and alternatively.

Wherein the electroluminescent device further includes a TFT array layer disposed between the substrate and the electroluminescent layer, an orthographic projection of the TFT array layer on the joint display panel is overlapped with the first edge frame and the second edge frame.

Wherein a material of each of the first edge frame and the second edge frame is a black matrix material.

Wherein the display device further includes a first adhesive layer disposed between the joint display panel and the electroluminescent display panel for bonding the joint display panel and electroluminescent display panel, a cover plate disposed above the panel, and a second adhesive layer provided between the electroluminescent display panel and the cover plate for bonding the electroluminescent display panel and the cover plate.

Wherein a material of each of the first adhesive layer and the second adhesive layer is a water glue or an optical glue; and a material of the cover plate is a glass.

The beneficial effect of the present invention, the display device of the present invention provides an electroluminescent display panel above the joint display panel. An orthographic projection of the electroluminescent layer on the joint display panel us overlapped with the edge frames of the display panel, and the electroluminescent layer includes multiple electroluminescent device. When the display device is operating, the multiple sub-display panels of the display panel and the multiple electroluminescent devices of the electroluminescent display panel can simultaneously emit a light in order to display an image in order to eliminate a black line generated by the edge frames of the joint display panel in order to increase the display effect to have a good product quality.

BRIEF DESCRIPTION OF THE DRAWINGS

In order to illustrate the features and the technology content in detail, please refer to the following related detailed description and drawings. However, the drawings are only for reference, not for limiting the present application.

In the figures.

DETAILED DESCRIPTION OF THE PREFERRED EMBODIMENT

In order to describe the technology solution and the effect of the present invention in advance, the following will combine the preferred embodiments and the drawings to illustrate the present invention in detail.

Figure 2:
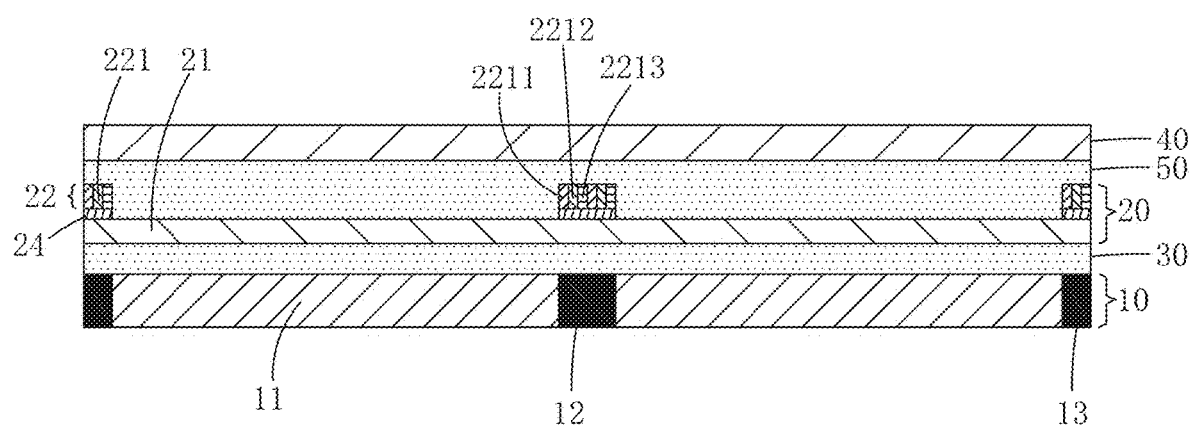
FIG. 2 is a schematic structural diagram of a display device according to a first embodiment of the present invention.

With reference to FIG. 2, the first embodiment of the display device of the present invention includes a joint display panel 10 and an electroluminescent display panel 20 disposed above the joint display panel 10.

The joint display panel 10 includes multiple sub-display panels 11 disposed at interval, a first edge frame 12 disposed between adjacent sub-display panels 11, and a second edge frame 13 disposed at outer side of the multiple sub-display panels 11.

The electroluminescent display panel 20 includes a substrate 21 and an electroluminescent layer 22 disposed on the substrate 21. An orthographic projection of the electroluminescent layer 22 on the joint display panel 10 is overlapped with the first edge frame 12 and the second edge frame 13.

The electroluminescent layer 22 includes multiple electroluminescent devices 221 disposed sequentially.

Specifically, in the first embodiment of the present invention, each of the sub-display panel 11 is a liquid crystal display panel.

Figure 1:
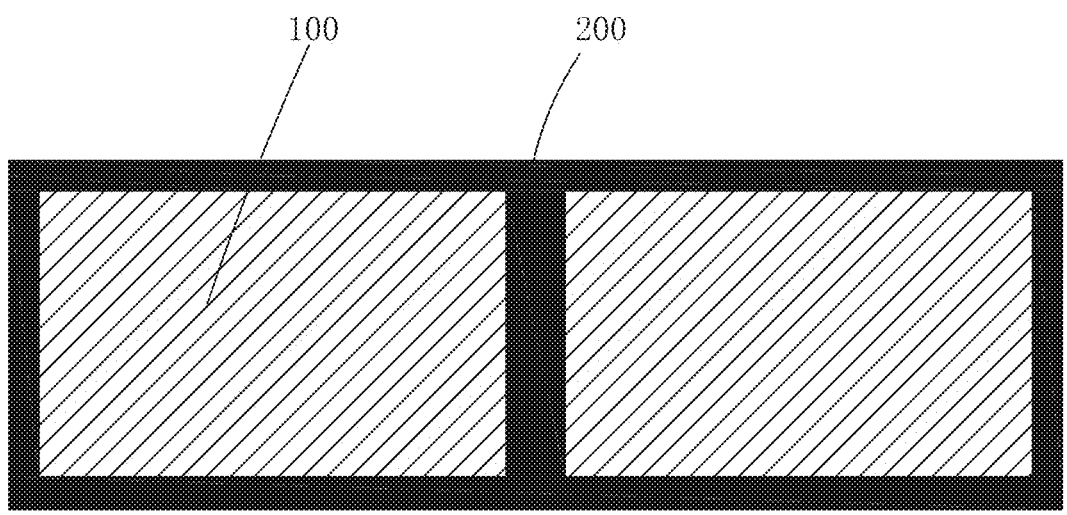
FIG. 1 is a schematic structural diagram of a conventional display device assembled from multiple display panels.

Specifically, the multiple sub-display panels 11 are arranged as a matrix. In the embodiment shown in FIG. 1, the number of the sub-display panels 11 is two, the two sub-display panels 11 are arranged in one row and two columns.

Specifically, a material of each of the first edge frame 12 and the second edge frame 13 is a black matrix material.

Specifically, a material of the substrate 21 can be a glass or a flexible material.

Specifically, with reference to FIG. 2, the electroluminescent display panel 20 further includes a TFT array layer 24 disposed between the substrate 21 and the electroluminescent layer 22. An orthographic projection of the TFT array layer 24 on the joint display panel 10 is overlapped with the first edge frame 12 and the second edge frame 13. The TFT array layer 24 is used for driving the electroluminescent device 221 in the electroluminescent layer 22 to emit a light in order to perform a display.

Specifically, with reference to FIG. 2, in the first embodiment of the present invention, the electroluminescent device 221 includes a red electroluminescent device 2211 that emits a red light, a green electroluminescent device 2212 that emits a green light and a blue electroluminescent device 2213 that emits a blue light. In the electroluminescent layer 22, the red electroluminescent device 2211, the green electroluminescent device 2212 and the blue electroluminescent device 2213 are disposed sequentially and alternatively. Of course, in another embodiment of the present invention, according to actual product requirement, the electroluminescent device 221 can be another electroluminescent device that can emit another light such as a white light electroluminescent device or a yellow electroluminescent device that can emit a yellow light.

Specifically, in the first embodiment of the present invention, the electroluminescent device 221 is a mini LED.

Specifically, with reference to FIG. 2, the display device further includes a first adhesive layer 30 disposed between the joint display panel 10 and the electroluminescent display panel 20 for bonding the joint display panel 10 and electroluminescent display panel 20, a cover plate 40 disposed above the panel 20, and a second adhesive layer 50 provided between the electroluminescent display panel 20 and the cover plate 40 for bonding the electroluminescent display panel 20 and the cover plate 40.

Furthermore, a material of each of the first adhesive layer 30 and the second adhesive layer 50 is a water glue or an optical glue. A material of the cover plate 40 is a glass. In the first embodiment of the present invention, the material of the first adhesive layer 30 and the second adhesive layer 50 is preferably the water glue.

Specifically, when manufacturing the display device according to the first embodiment of the present invention, firstly, providing the joint display panel 10, then, providing the substrate 21 and manufacturing the TFT array layer 24 on the substrate 21. Then, boding the electroluminescent devices 221 of the mini LED on the substrate 21 providing with the TFT array layer 24 to form the electroluminescent layer 22 in order to obtain the electroluminescent display panel 20. Then, bonding a side of a side of the electroluminescent display panel 20 having the substrate 21 with a side surface of the display panel 10 through the water glue. Then, adhering the cover plate 40 at a side of the electroluminescent display panel 20 away from the joint display panel 10 through the water glue and finish manufacturing.

Figure 4:
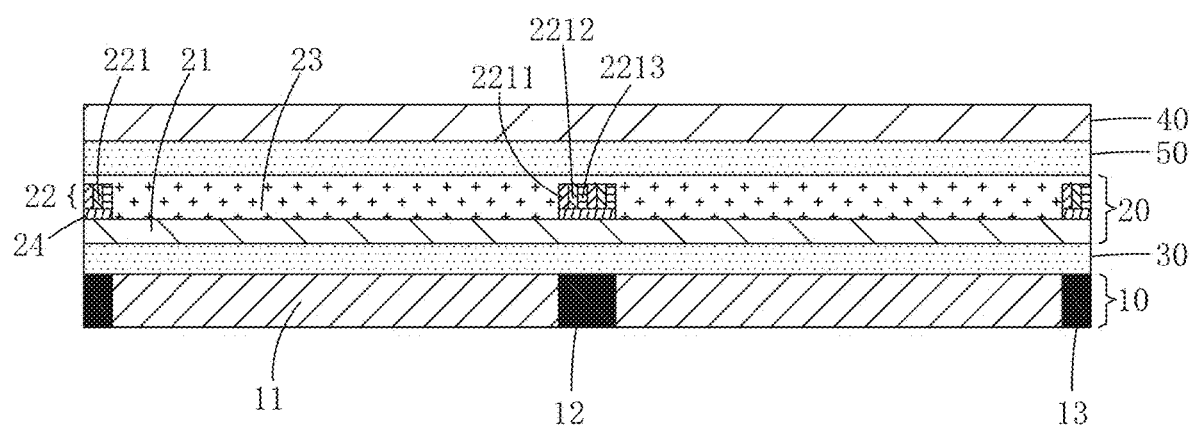
FIG. 4 is a schematic structural diagram of a display device according to a second embodiment of the present invention.

With reference to FIG. 4, the difference between the second embodiment of the present invention and the first embodiment is that the electroluminescent device 221 is an OLED.

Further, with reference to FIG. 4, in the second embodiment of the present invention, the electroluminescent display panel 20 further includes an encapsulation layer 23 covering multiple electroluminescent devices 221 for blocking external water and oxygen intrusion to improve the reliability and life of the OLED electroluminescent device 221.

Correspondingly, when manufacturing the display device according to the second embodiment of the present invention, firstly, providing the joint display panel 10, then, providing the substrate 21 and manufacturing the TFT array layer 24 on the substrate 21. Then, forming the electroluminescent devices 221 of the OLED on the substrate 21 providing with the TFT array layer 24 to form the electroluminescent layer 22. Then, forming the encapsulation layer 23 on the substrate 21 and the electroluminescent device 221 to cover the electroluminescent devices 221 in order to obtain the electroluminescent display panel 20. Then, bonding a side of a side of the electroluminescent display panel 20 having the substrate 21 with a side surface of the display panel 10 through the water glue. Then, adhering the cover plate 40 at a side of the electroluminescent display panel 20 away from the joint display panel 10 through the water glue and finish manufacturing.

Figure 3:
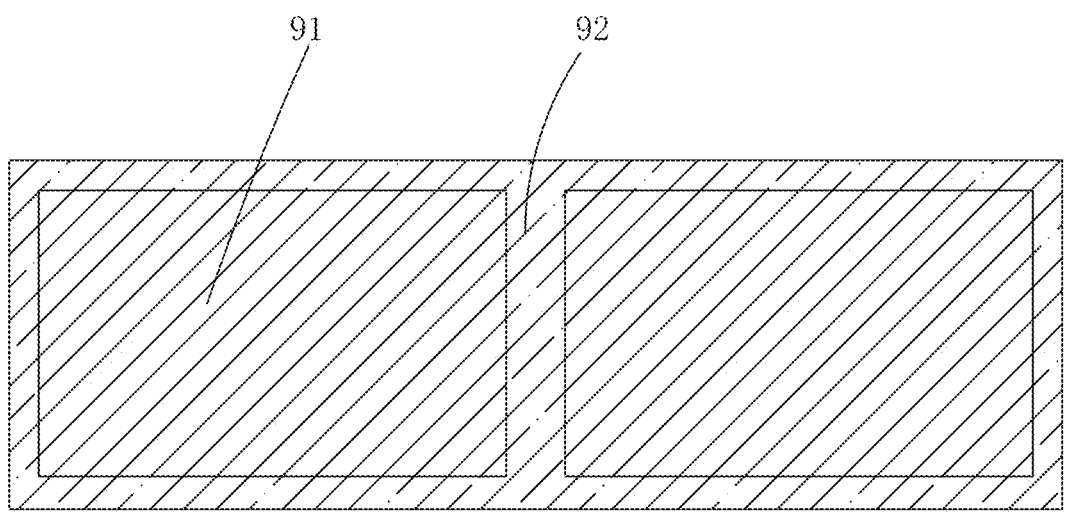
FIG. 3 is a schematic diagram of a display screen of the display device of the present invention.

It should be noted that the display device of the present invention provides with an electroluminescent display panel 20 above the joint display panel 10, an orthographic projection of the electroluminescent layer 22 of the electroluminescent display panel 20 is overlapped with the first edge frame 12 and the second edge frame 13 of the display panel 10, and the electroluminescent layer 22 includes multiple electroluminescent devices 221, which can be driven to emit a light. With reference to FIG. 3, when the display device of the present invention is operating, the multiple sub-display panels 11 of the joint display panel 10 emits a light so that a first display region 91 corresponding to the multiple sub-display panels 11 displays an image. The multiple electroluminescent devices 221 of the electroluminescent display panel 20 emit a light so that a second display region 92 of the display device corresponding to the electroluminescent layer 22 also displays an image such that a displayed image of the display device covers the display device. Comparing to the conventional art, the present invention can eliminate a black line generated by the edge frames of the joint display panel in order to increase the display effect to have a good product quality.

In summary, the display device of the present invention provides an electroluminescent display panel above the joint display panel. An orthographic projection of the electroluminescent layer on the joint display panel us overlapped with the edge frames of the display panel, and the electroluminescent layer includes multiple electroluminescent device. When the display device is operating, the multiple sub-display panels of the display panel and the multiple electroluminescent devices of the electroluminescent display panel can simultaneously emit a light in order to display an image in order to eliminate a black line generated by the edge frames of the joint display panel in order to increase the display effect to have a good product quality.

The above embodiments of the present invention are only exemplary, however, the present invention is not limited. The person skilled in the art can understand: without exceeding the principle and spirit of the present invention, the above embodiments can be improved, wherein, the scope of the present invention is limited in the claims and the equivalents of the claims.

What is claimed is:

1. A display device, comprising:
   a joint display panel including multiple sub-display panels disposed at interval, a first edge frame disposed between adjacent sub-display panels, and a second edge frame disposed at outer side of the multiple sub-display panels; and
   an electroluminescent display panel including a substrate and an electroluminescent layer disposed on the substrate, an orthographic projection of the electroluminescent layer on the joint display panel is overlapped with the first edge frame and the second edge frame;
   wherein the electroluminescent layer includes multiple electroluminescent devices disposed sequentially;
   wherein the display device further includes a first adhesive layer disposed between the joint display panel and the electroluminescent display panel for bonding the joint display panel and electroluminescent display panel, a cover plate disposed above the panel, and a second adhesive layer provided between the electroluminescent display panel and the cover plate for bonding the electroluminescent display panel and the cover plate.

2. The display device according to claim 1, wherein each of the sub-display panel is a liquid crystal display panel, and the multiple sub-display panels are arranged as a matrix.

3. The display device according to claim 1, wherein the electroluminescent device is a mini LED.

4. The display device according to claim 1, wherein the electroluminescent device is an OLED.

5. The display device according to claim 4, wherein the electroluminescent display panel further includes an encapsulation layer that covers the multiple electroluminescent devices.

6. The display device according to claim 1, wherein the electroluminescent device includes a red electroluminescent device, a green electroluminescent device and a blue electroluminescent device, in the electroluminescent layer, the red electroluminescent device, the green electroluminescent device and the blue electroluminescent device are disposed sequentially and alternatively.

7. The display device according to claim 1, wherein the electroluminescent device further includes a TFT array layer disposed between the substrate and the electroluminescent layer, an orthographic projection of the TFT array layer on the joint display panel is overlapped with the first edge frame and the second edge frame.

8. The display device according to claim 1, wherein a material of each of the first edge frame and the second edge frame is a black matrix material.

9. The display device according to claim 1, wherein a material of each of the first adhesive layer and the second adhesive layer is a water glue or an optical glue; and a material of the cover plate is a glass.

* * * * *